(12) United States Patent
Snoeij et al.

(10) Patent No.: US 12,518,114 B2
(45) Date of Patent: Jan. 6, 2026

(54) BIPOLAR TRANSISTOR LOGARITHMIC CONVERTER WITH AC DIODE CONNECTION

(71) Applicant: Texas Instruments Incorporated, Dallas, TX (US)

(72) Inventors: Martijn Snoeij, Freising (DE); Viola Schaffer, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 822 days.

(21) Appl. No.: 17/729,210

(22) Filed: Apr. 26, 2022

(65) Prior Publication Data
US 2023/0342564 A1   Oct. 26, 2023

(51) Int. Cl.
*G06G 7/24*   (2006.01)
(52) U.S. Cl.
CPC ..................... *G06G 7/24* (2013.01)
(58) Field of Classification Search
None
See application file for complete search history.

(56) References Cited

U.S. PATENT DOCUMENTS

| | | | | |
|---|---|---|---|---|
| 3,760,185 A * | 9/1973 | Green | ...................... | G06G 7/24 356/411 |
| 4,891,603 A * | 1/1990 | Oda | ...................... | G06G 7/24 330/110 |
| 5,004,906 A * | 4/1991 | Takasaki | ...................... | H03G 7/00 250/584 |
| 5,126,846 A * | 6/1992 | Niimura | ...................... | H03G 9/025 348/613 |
| 5,578,958 A * | 11/1996 | Yasuda | ...................... | H03G 7/001 327/350 |
| 6,265,928 B1 * | 7/2001 | Tran | ...................... | G06G 7/24 327/350 |
| 8,004,341 B1 * | 8/2011 | Gilbert | ...................... | G06G 7/24 327/350 |
| 11,502,655 B2 * | 11/2022 | Snoeij | ...................... | H03F 3/45475 |

* cited by examiner

*Primary Examiner* — Cassandra F Cox
(74) *Attorney, Agent, or Firm* — Mandy Barsilai Fernandez; Frank D. Cimino

(57) ABSTRACT

A logarithmic converter circuit includes a converter input and a converter output. The circuit includes a first transistor which includes a control terminal, a first terminal coupled to the converter input, and a second terminal coupled to the converter output. The circuit includes a first operational amplifier which includes a first input coupled to the converter input, a second input coupled to a common potential, and an output coupled to the second terminal. The circuit includes a first capacitor coupled between the first terminal and the control terminal and includes a first resistor coupled between the control terminal and the common potential.

20 Claims, 4 Drawing Sheets

BIPOLAR TRANSISTOR LOGARITHMIC CONVERTER WITH AC DIODE CONNECTION

TECHNICAL FIELD

This description relates generally to logarithmic converters, and more particularly to a bipolar transistor logarithmic converter with an AC diode connection.

BACKGROUND

A logarithmic converter is a non-linear electronic circuit that generates an output signal that is proportional to a logarithm of an input signal. In signal processing, a logarithmic converter is used to compress input signals having a large dynamic range to output signals having a manageable smaller range. A logarithmic converter is also used to perform mathematical operations such as multiplications, divisions, and exponentials.

In a bipolar transistor, a base-to-emitter voltage ($V_{BE}$) is proportional to a logarithm of a collector current ($I_C$) ranging between around one picoamp to more than one milliamp. Thus, bipolar transistors are used as logarithmic converters because of their non-linear characteristics. Output signals generated by photo diodes, sensors, and receivers are often compressed using bipolar transistors.

SUMMARY

In one aspect, a logarithmic converter circuit includes a converter input and a converter output. The circuit includes a first transistor which includes a control terminal, a first terminal coupled to the converter input, and a second terminal coupled to the converter output. The circuit includes a first operational amplifier which includes a first input coupled to the converter input, a second input coupled to a common potential and an output coupled to the second terminal. The circuit includes a first capacitor coupled between the first terminal and the control terminal and includes a first resistor coupled between the control terminal and the common potential.

In an additional aspect, the circuit includes a buffer which includes an input coupled to the first capacitor and the first resistor, and an output coupled to the control terminal of the first transistor.

In an additional aspect, the first capacitor and the first resistor are coupled to the control terminal of the first transistor via a buffer.

In an additional aspect, the control terminal is a base, the first terminal is a collector, and the second terminal is an emitter.

In an additional aspect, the buffer includes a second transistor which includes a control terminal coupled to the capacitor, a third terminal coupled to a first potential, and a fourth terminal coupled to the control terminal of the first transistor. The buffer includes a third transistor which includes a control terminal coupled to the third terminal of the second transistor, a fifth terminal coupled to the first potential, and a sixth terminal coupled to the control terminal of the first transistor.

In an additional aspect, the first input of the first operational amplifier is an inverting input, and the second input of the first operational amplifier is a non-inverting input.

In an additional aspect, a logarithmic converter circuit includes a converter input and a converter output. The circuit includes a first transistor which includes a control terminal, a first terminal coupled to the converter input, and a second terminal coupled to the converter output. The circuit includes a first operational amplifier which includes a first input coupled to the converter input, a second input coupled to a common potential, and an output coupled to the second terminal. The circuit includes a second operational amplifier which includes an output, a third input coupled to the control terminal, and a fourth input adapted to be coupled to a bias voltage. The circuit includes a first resistor coupled between the control terminal and the output of the second amplifier and includes a first capacitor coupled between the first terminal and the first resistor.

In an additional aspect, the first input of the first operational amplifier is an inverting input, the second input of the first operational amplifier is a non-inverting input, the third input of the second operational amplifier is an inverting input, and the fourth input of the second operational amplifier is a non-inverting input.

In an additional aspect, a logarithmic converter circuit includes a converter input and a converter output. The circuit includes a first transistor which includes a base, a collector coupled to the converter input, and an emitter coupled to the converter output. The circuit includes a first operational amplifier which includes an inverting input coupled to the converter input, a non-inverting input coupled to a common potential, and an output coupled to the converter output. The circuit includes a second operational amplifier which includes an output, an inverting input coupled to the base, and a non-inverting input adapted to be coupled to a bias voltage. The second operational amplifier is operable to regulate a voltage at the base of the first transistor responsive to the bias voltage. The circuit includes a buffer which includes an input, and an output coupled to the base. The circuit includes a high-pass filter which includes a first terminal coupled to the collector, a second terminal coupled to the input of the buffer circuit, and a third terminal coupled to the output of the second amplifier. The high-pass filter electrically connects the base to the collector if the input current has a high frequency and disconnects the base from the collector if the input current is a direct current (DC).

In an additional aspect, a logarithmic converter circuit includes a converter input and a converter output. The circuit includes a first transistor which includes a control terminal, a first terminal coupled to the converter input, and a second terminal coupled to the converter output. The circuit includes a first operational amplifier which includes an inverting input coupled to the converter input, a non-inverting input coupled to a common potential, and an output coupled to the second terminal. The circuit includes a high-pass filter coupled to the converter input and the control terminal.

DETAILED DESCRIPTION

Figure 1:
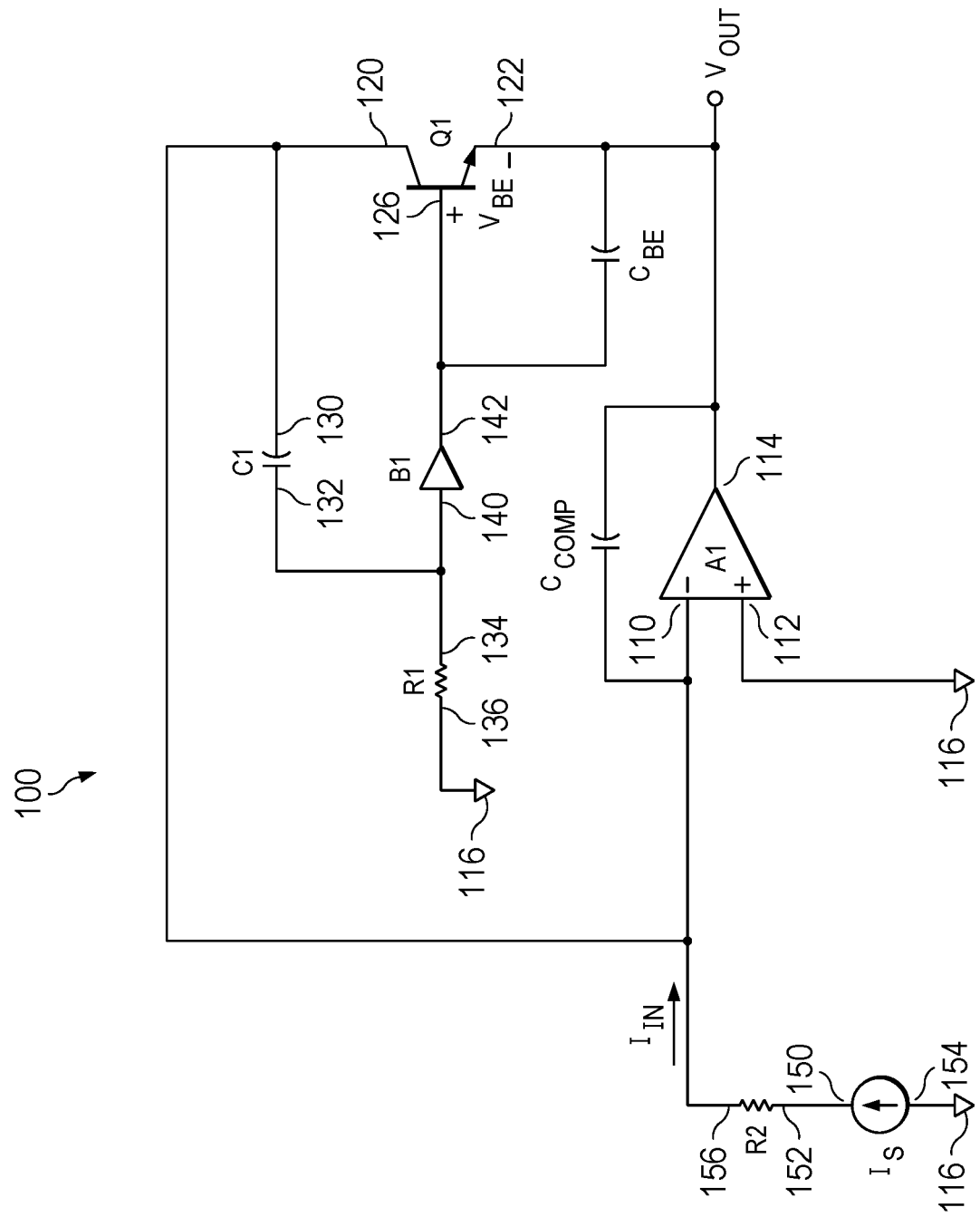
FIG. 1 illustrates a schematic diagram of a logarithmic converter circuit of an example embodiment.

FIG. 1 illustrates a schematic diagram of a logarithmic converter circuit 100 of an example embodiment. The logarithmic converter circuit 100 can be utilized in various systems such as, for example, fiber-optical communication systems, industrial systems, electrochemical systems, automotive systems, optoelectronic systems, radar systems and sensors. In many systems, the logarithmic converter circuit 100 can be used, for example, as analog signal conditioners, log and antilog amplifiers, instrumentation amplifiers, and measurement and control circuitry. The logarithmic converter circuit 100 compresses signals generated by, for example, sensors, receivers, and photo diodes to output signals having a manageable smaller range.

The logarithmic converter circuit 100 includes an operational amplifier A1 coupled to a bipolar junction transistor Q1. The operational amplifier A1 includes an inverting input 110, a non-inverting input 112, and an output 114. The non-inverting input 112 is coupled to a common potential 116 (e.g., ground). The transistor Q1 includes a first terminal 120 (e.g., collector) coupled to the inverting input 110 of the operational amplifier A1 and includes a second terminal 122 (e.g., emitter) coupled to the output 114 of the operational amplifier A1. The transistor Q1 includes a control terminal 126 (e.g., base). A parasitic capacitor $C_{BE}$ is present between the base 126 and the emitter 122. The transistor Q1 is connected in a feedback path (e.g., a feedback path between the inverting input 110 and output 114) of the operational amplifier A1. In some example embodiments, the transistor Q1 is an NPN transistor.

The circuit 100 includes a high-pass filter which includes a resistor R1 (e.g., between around 150 ohms to around 15K ohms) and a capacitor C1 (e.g., between around 0.1 picofarad to around 10 picofarads). The capacitor C1 includes a first terminal 130 coupled to the collector 120 of the transistor Q1. The capacitor C1 includes a second terminal 132 coupled to a first terminal 134 of the resistor R1. The resistor R1 includes a second terminal 136 coupled to the common potential 116 (e.g., ground).

In some example embodiments, the circuit 100 includes a buffer B1 which includes an input 140 coupled to the second terminal 132 of the capacitor C1 (and to the first terminal 134 of the resistor R1). The buffer B1 includes an output 142 coupled to the base 126 of the transistor Q1. The buffer B1 functions as a current-boost circuit which supplies current to drive the base 126 of the transistor Q1. In some example embodiments, the buffer B1 may have a gain of approximately 1. In other example embodiments, the buffer B1 may have a gain between around 0.6 to around 1.5. In some example embodiments, the circuit 100 may not include the buffer B1, and in such embodiments the capacitor C1 and the resistor R1 can be directly coupled to the base 126 of the transistor Q1.

The logarithmic converter circuit 100 is adapted to receive an input current $I_{IN}$ and provide an output voltage $V_{OUT}$ at the output 114 of the operational amplifier A1. The output voltage $V_{OUT}$ is proportional to a logarithm of the input current $I_{IN}$. A current source $I_S$ can be coupled via a resistor R2 to the inverting input 110 to provide the input current $I_{IN}$. The current source $I_S$ may, for example, be a photo diode, a radar, a sensor, a fiber-optical communication system, an industrial system, an automotive system, or an electrochemical system. In some example embodiments, the current source $I_S$ may have a wide range (e.g., between around 1 picoamp to around 1 amp). The current source $I_S$ includes a first terminal 150 coupled to a first terminal 152 of the resistor R2. The current source $I_S$ includes a second terminal 154 coupled to the common potential 116 (e.g., ground). The resistor R2 (e.g., between around 5 ohms to around 1K ohms) includes a second terminal 156 coupled to the inverting input 110 of the operational amplifier A1. In some example embodiments, the current source $I_S$ may be directly connected to the inverting input 110 of the operational amplifier A1, and thus in such embodiments the circuit 100 may not include the resistor R2. Alternatively, the signal source may include a current source and/or a voltage source.

If the input current $I_{IN}$ is a DC signal or a low frequency signal (e.g., less than 50 MHz), the capacitor C1 functions as an open circuit. As a result, the base 126 of the transistor Q1 is electrically disconnected (via the C1 path) from the collector 120, and the base 126 is coupled to the common potential 116 (e.g., ground) via the resistor R1. Thus, at low frequency the transistor Q1 has a common-base connection because the base 126 is coupled to the common potential 116.

Due to the high input impedance of the operational amplifier A1, the input current $I_{IN}$ flows into the transistor Q1 through the collector 120. Because C1 acts as an open circuit when the transistor Q1 is in a common-base connection, the parasitic capacitor $C_{BE}$ is not charged by $I_{IN}$ but is instead charged by the operational amplifier A1. Thus, the transistor Q1 conducts even if the input current $I_{IN}$ is low (e.g., 100 nanoamps) and provides an output voltage $V_{OUT}$. The effect of this is that the circuit 100 operates at high speed at low input current in a common-base connection. For example, if the input current $I_{IN}$ is increased in a step from around 1 nanoamp to around 10 nanoamps, the output voltage $V_{OUT}$ also changes quickly to reflect the step change in the input current.

When the transistor Q1 is connected in a common-base connection, there are two gain stages in the circuit 100. One includes the operational amplifier A1, and the other includes transistor Q1. In some example embodiments, to stabilize the circuit 100 with two gain stages, a compensation capacitor $C_{COMP}$ may be coupled between the output 114 and the inverting input 110. However, since the input current $I_{IN}$ charges the compensation capacitor $C_{COMP}$, the speed of the circuit 100 is reduced.

If the input signal (e.g., input current $I_{IN}$) is a high frequency signal (e.g., greater than 50 MHz), the capacitor C1 acts as a short thereby connecting the base 126 of Q1 to the collector 120 via the buffer B1. With the base 126 being effectively connected to the collector 120, the transistor Q1 is connected as a diode. Hence, for a high frequency input signal, the transistor Q1 functions essentially as a diode. Thus, a change in the input current is reflected by a change in a base-to-emitter voltage $V_{BE}$ of the transistor Q1. Because $V_{OUT}$ equals $-V_{BE}$, a change in the input current is reflected by a change in the output voltage $V_{OUT}$. Also, when the transistor Q1 is connected as a diode, the circuit 100 includes only a single gain stage (e.g., the operational amplifier A1), and thus the circuit 100 is generally stable.

When the transistor Q1 is connected as a diode, the parasitic capacitance $C_{BE}$ is charged by the input current $I_{IN}$. If the input current $I_{IN}$ is high (e.g., greater than 100 microamps), the parasitic capacitor $C_{BE}$ is charged rapidly, and thus the transistor Q1 conducts quickly. If, however, the input current $I_{IN}$ is low (e.g., less than 100 microamps), the transistor Q1 does not immediately conduct because of the delay associated with charging the parasitic capacitor $C_{BE}$ by the low input current $I_{IN}$, and as a result the circuit 100 responds slowly.

The circuit 100 combines advantages of both the diode connection and the common-base connection of the transistor Q1. At low frequencies, the transistor Q1 has a common-base connection which allows the parasitic capacitor $C_{BE}$ to be charged by the amplifier A1, and as a result the circuit 100 is able to operate at high speed even at a low input current. At high frequencies, the transistor Q1 is connected as a diode. If at high frequencies, there is a step change of the input current $I_{IN}$ (e.g., input current changes from 1 milliamp to 10 milliamps), because the circuit 100 contains only a single amplifier stage (e.g., A1), the circuit 100 is generally stable and provides a stable step response.

When the transistor Q1 is in a common-base connection, the base 126 is coupled to the common potential 116 (e.g., ground). Because the non-inverting input 112 of the operational amplifier A1 is coupled to the common potential 116, the inverting input 110 is at a virtual ground. As a result, the output voltage $V_{OUT}$ is controlled by the operational amplifier A1, and the buffer B1 controls the voltage at the base 126 of the transistor Q1.

Figure 2:
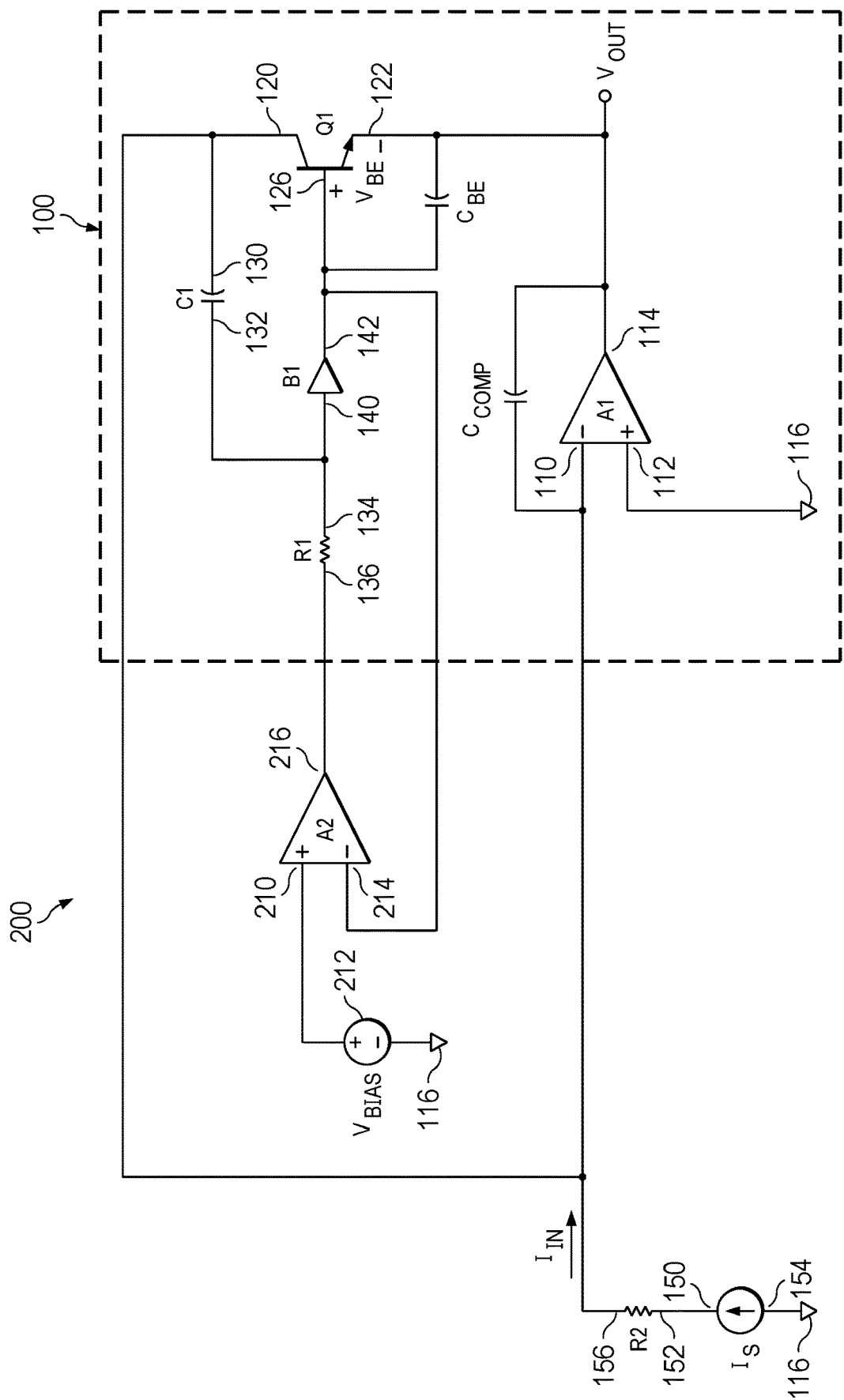
FIG. 2 illustrates a schematic diagram of a logarithmic converter circuit of an example embodiment that includes two operational amplifiers.

In some example embodiments, a second operational amplifier is added to the logarithmic converter circuit 100 in order to more accurately drive the base 126 of the transistor Q1. FIG. 2 illustrates a schematic diagram of a logarithmic converter circuit 200 which incorporates a second operational amplifier A2. In the embodiment illustrated in FIG. 1, the buffer B1 ideally should provide both high-speed performance and DC accuracy (e.g., offset) to drive the base 126 of the transistor Q1. However, it is difficult in practice to implement a buffer which provides both high-speed and DC accuracy. Thus, in the embodiment illustrated in FIG. 2, the operational amplifier A2 is added, which provides DC accuracy and low-speed regulation (e.g., regulation for switching frequencies around 100 kHz to around 10 MHz) of the voltage at the base 126 of the transistor Q1. The operational amplifier A2 includes a non-inverting input 210 coupled to a voltage source 212 which applies a bias voltage $V_{BIAS}$ to the non-inverting input 210. The operational amplifier A2 includes an inverting input 214 which is coupled to the base 126 of the transistor Q1. The operational amplifier A2 includes an output 216 coupled to the second terminal 136 of the resistor R1. The input 140 of the buffer B1 is coupled to the first terminal 134 of the resistor R1, and the output 142 of the buffer B1 is coupled to the base 126 of the transistor Q1. The first terminal 130 of the capacitor C1 is coupled to the collector 120 of the transistor Q1, and the second terminal 132 of the capacitor C1 is coupled to the input 140 of the buffer B1. The circuit 200 is similar to the circuit 100 except for the addition of the operational amplifier A2.

The operational amplifier A2 compares the voltage at the base 126 of the transistor Q1 to the bias voltage $V_{BIAS}$. If there is a difference between $V_{BIAS}$ and the voltage at the base 126, the operational amplifier A2 adjusts the voltage at the output 216. Because the output 216 is coupled to the base 126 via the resistor R1 and the buffer B1, the operational amplifier A2 causes the voltage at the base 126 of the transistor Q1 to be approximately equal to $V_{BIAS}$.

In some example embodiments, the non-inverting input 210 of the operational amplifier A2 may be connected to the common potential 116 instead of being connected to $V_{BIAS}$. In such embodiments, the operational amplifier A2 compares the voltage at the base 126 to the common potential and adjusts the voltage at the output 216.

Figure 3:
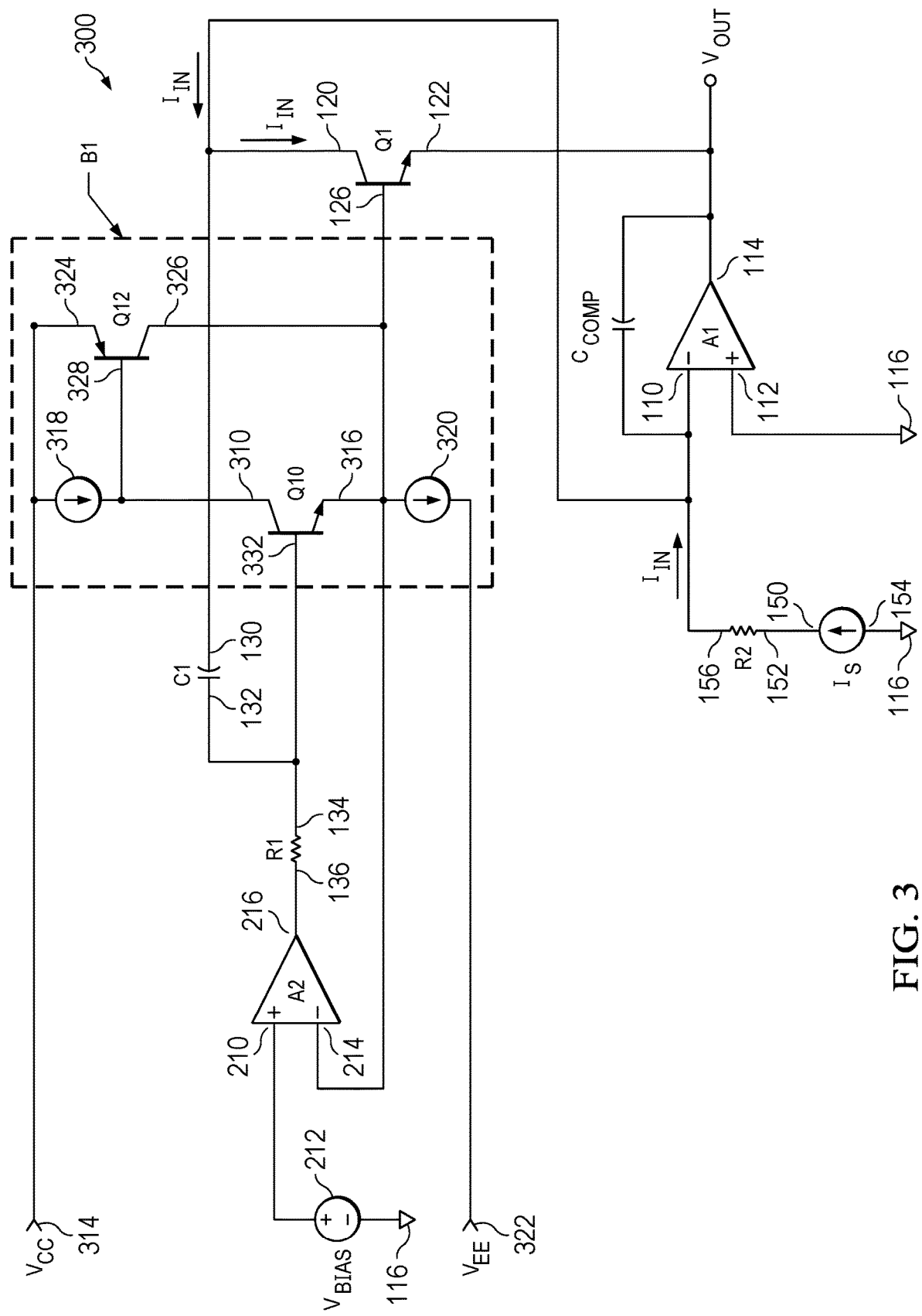
FIG. 3 illustrates a schematic diagram of a logarithmic converter circuit of an example embodiment that includes an example implementation of a buffer.

FIG. 3 illustrates a circuit 300 which includes an example implementation of the buffer B1 illustrated in FIGS. 1 and 2. The buffer B1 includes transistors Q10 and Q12. In some example embodiments, the transistor Q10 is an NPN transistor, and the transistor Q12 is a PNP transistor. The transistor Q10 includes a collector 310 coupled to a first potential 314 (e.g., positive voltage supply $V_{CC}$) and includes an emitter 316 coupled to the base 126 of the transistor Q1. In some example embodiments, the buffer B1 includes a bias current source 318 coupled between the collector 310 and the first potential 314 and includes a bias current source 320 coupled between the emitter 316 and a second potential 322 (e.g., negative voltage supply $V_{EE}$). The bias current sources 318 and 320, which are described below, allow the transistors Q10 and Q12 to properly operate as a buffer. The buffer B1 is generally referred to as a super emitter follower.

The transistor Q12 includes an emitter 324 coupled to the first potential 314 and includes a collector 326 coupled to the emitter 316 of the transistor Q10 (and to the base 126 of the transistor Q1). The transistor Q12 includes a base 328 coupled to the collector 310 of the transistor Q10. A high pass filter is formed by the capacitor C1 and the resistor R1. The capacitor C1 includes the first terminal 130 coupled to the collector 120 of the transistor Q1 and includes the second terminal 132 coupled to a base 332 of the transistor Q10. The resistor R1 includes the first terminal 134 coupled to the base 332 of the transistor Q10 and includes the second terminal 136 coupled to the output 216 of the operational amplifier A2.

The operational amplifier A1 includes the inverting input 110 coupled to the collector 120 of the transistor Q1 and includes the non-inverting input 112 coupled to the common potential 116 (e.g., ground). The output 114 of the amplifier A1 is coupled to the emitter 122 of the transistor Q1.

The transistors Q10 and Q12 provide current to drive the base 126 of the transistor Q1. If more current is required at the base 126 of the transistor Q1, the transistor Q10 conducts more current which causes the voltage at the collector 310 of the transistor Q10 to fall. Thus, the voltage between the base 328 and the emitter 324 of the transistor Q12 drops which causes the transistor Q12 (e.g., PNP transistor) to conduct more current, which in turn causes the transistor Q10 to conduct less current. Conversely, if less current is required at the base 126 of the transistor Q1, the transistor Q10 conducts less current which causes the voltage at the collector 310 of the transistor Q10 to increase. Thus, the voltage between the base 328 and the emitter 324 of the transistor Q12 increases which causes the transistor Q12 to conduct less current which in turn causes the transistor Q10 to conduct more current. The effect of this is that the current level at the base 126 of the transistor Q1 is maintained, and thus the voltage at the base 126 of the transistor Q1 is kept approximately constant.

In some example embodiments, the bias current source 320 conducts a larger current than the bias current source 318 which ensures that the difference in current flows through the transistor Q12. The transistor Q12 then senses the voltage at the collector 310 and ensures that the bias current from the bias current source 318 flows through the transistor Q10, regardless of the current flowing into the base 126 of the transistor Q1.

In operation, if $I_{IN}$ is low (e.g., less than 100 microamps) the transistor Q1 operates at a lower speed (e.g., a lower switching speed). In addition, if $I_{IN}$ is low, capacitor C1 behaves as an open circuit (e.g., C1 has a high impedance), thus electrically disconnecting the base 332 of the transistor Q10 from the collector 120 of the transistor Q1. The transistor Q10 acts as an emitter-follower where the voltage at the emitter 316 follows the voltage at the base 332. In response to a difference between the voltage at the base 126 of the transistor Q1 and the bias voltage $V_{BIAS}$, the operational amplifier A2 adjusts the voltage at the output 216. Because the transistor Q10 acts as an emitter-follower, the voltage at the emitter 316 follows any change in the voltage at the output 216 of the operational amplifier A2. As a result, the voltage at the base 126 of the transistor Q1 is approximately equal to $V_{BIAS}$. At high frequencies (e.g., where the input signal has a high frequency), the capacitor C1 acts as a short (e.g., C1 has a very low impedance), and as a result the collector 120 of the transistor Q1 is electrically connected to the base 126 via the transistor Q10. Thus, the transistor Q1 is connected as a diode. In response to the input current $I_{IN}$, the transistor Q1 provides an output voltage $V_{OUT}$ which is proportional to the logarithm of $I_{IN}$.

Figure 4:
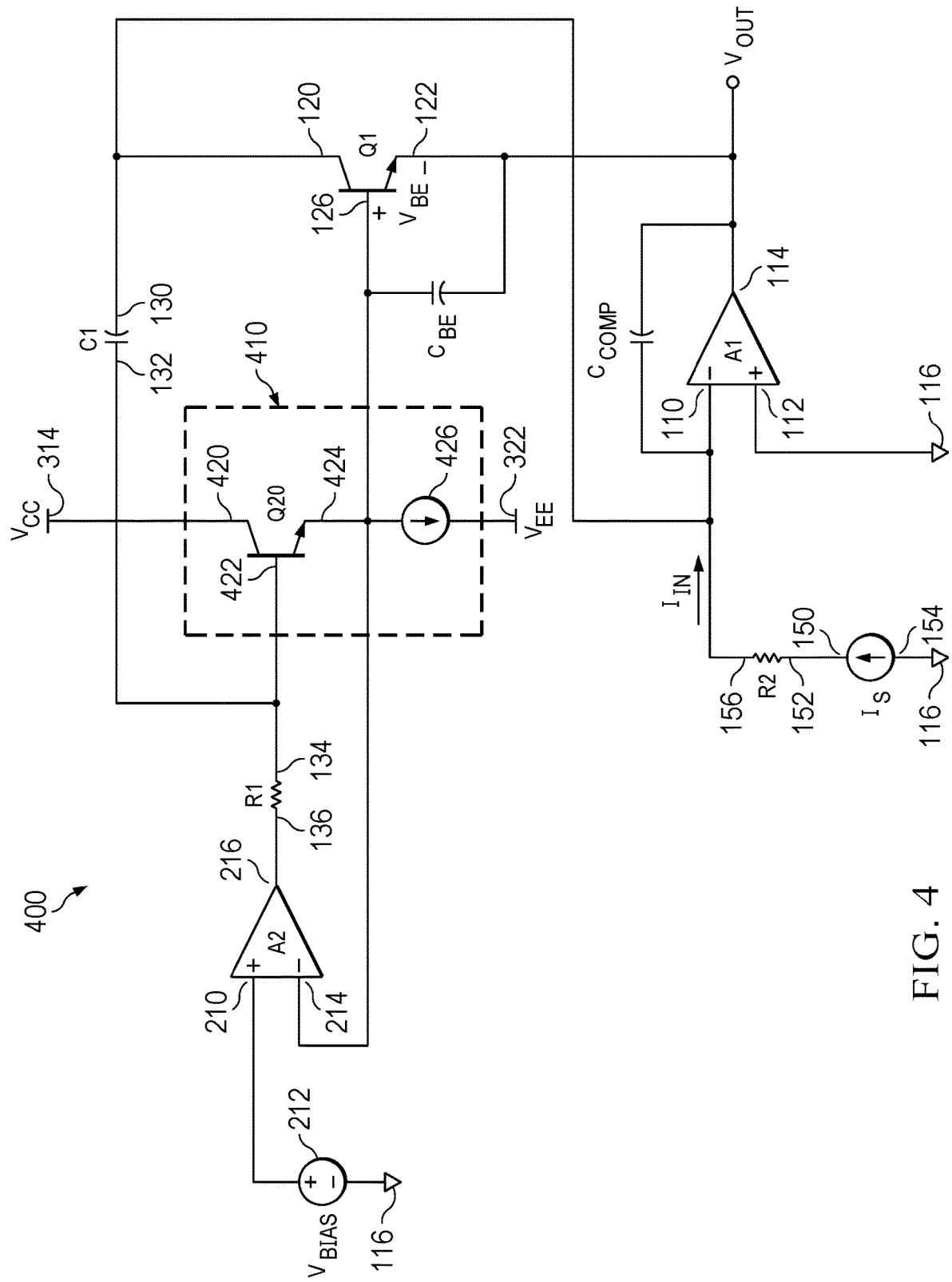
FIG. 4 illustrates a schematic diagram of a logarithmic converter circuit of an example embodiment that includes an emitter follower.

In some example embodiments, the buffer B1 illustrated in FIG. 2 can be replaced with an emitter follower. FIG. 4 illustrates a logarithmic converter circuit 400 in which the buffer is replaced with an emitter follower 410. The emitter follower 410 includes a transistor Q20 which includes a collector 420 coupled to the first potential 314 (e.g., positive voltage supply $V_{CC}$). The transistor Q20 includes an emitter 424 coupled to the base 126 of the transistor Q1. A bias current source 426 is coupled between the emitter 424 of the transistor Q20 and the second potential 322 (e.g., negative voltage supply $V_{EE}$). The transistor Q20 includes a base 422 coupled to the first terminal 134 of the resistor R1 and to the second terminal 132 of the capacitor C1. The circuit 400 is similar to the circuit 200 except that the buffer B1 is replaced with the emitter follower 410. The transistor Q20 functions as an emitter follower so that the voltage at the emitter 424 follows the voltage at the base 422. In response to a difference between the bias voltage $V_{BIAS}$ and the voltage at the base 126 of the transistor Q1, the operational amplifier A2 adjusts the voltage at the base 422 of the transistor Q20. Because the transistor Q20 functions as an emitter follower, the voltage at the emitter 424 also changes, thus allowing regulation of the base-to-emitter voltage $V_{BE}$ of the transistor Q1.

The circuits described herein may include one or more semiconductor elements (such as transistors), one or more passive elements (such as resistors, capacitors and/or inductors), and/or one or more sources (such as voltage and/or current sources). The circuits may include only semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party. While some example embodiments may include certain elements implemented in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

In this description, the term "couple" may cover connections, communications, or signal paths that enable a functional relationship consistent with this description. For example, if device A provides a signal to control device B to perform an action, then: (a) in a first example, device A is coupled to device B; or (b) in a second example, device A is coupled to device B through intervening component C if intervening component C does not substantially alter the functional relationship between device A and device B, such that device B is controlled by device A via the control signal provided by device A. Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, in this description, a circuit or device that includes certain components may instead be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device or other electronics or semiconductor component.

While some example embodiments suggest that certain elements are included in an integrated circuit while other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g., NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While certain components may be described herein as being of a particular process technology, these components may be exchanged for components of other process technologies. Circuits described herein are reconfigurable to include the replaced components to provide functionality at least partially similar to functionality available before the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in series or in parallel between the same two nodes as the single resistor or capacitor. Also, uses of the phrase "ground terminal" in this description include a chassis ground, an Earth ground, a floating ground, a virtual ground, a digital ground, a common ground, and/or any other form of ground connection applicable to, or suitable for, the teachings of this description. Unless otherwise stated, "about", "approximately", or "substantially" preceding a value means+/−10 percent of the stated value, or, if the value is zero, a reasonable range of values around zero.

What is claimed is:

1. A logarithmic converter circuit comprising:
   a converter input and a converter output;
   a first transistor having a control terminal, a first terminal coupled to the converter input, and a second terminal coupled to the converter output;
   a first operational amplifier having a first input coupled to the converter input, a second input coupled to a common potential, and an output coupled to the second terminal;
   a high-pass filter coupled to the converter input and the control terminal; and
   a buffer having an input coupled to the high-pass filter and an output coupled to the control terminal.

2. The logarithmic converter circuit of claim 1, wherein the first transistor is a bipolar transistor, and wherein the control terminal is a base, the first terminal is a collector, and the second terminal is an emitter.

3. The logarithmic converter circuit of claim 1, wherein the first input of the first operational amplifier is an inverting input and the second input of the first operational amplifier is a non-inverting input.

4. A logarithmic converter circuit comprising:
   a converter input and a converter output;
   a first transistor having a control terminal, a first terminal coupled to the converter input, and a second terminal coupled to the converter output;
   a first operational amplifier having a first input coupled to the converter input, a second input coupled to a common potential, and an output coupled to the second terminal;
   a high-pass filter coupled to the converter input and the control terminal, wherein the high-pass filter comprises:
      a first capacitor coupled between the first terminal and the control terminal; and
      a first resistor coupled between the control terminal and the common potential.

5. A logarithmic converter circuit comprising:
   a converter input and a converter output;
   a first transistor having a control terminal, a first terminal coupled to the converter input, and a second terminal coupled to the converter output;
   a first operational amplifier having a first input coupled to the converter input, a second input coupled to a common potential, and an output coupled to the second terminal;
   a high-pass filter coupled to the converter input and the control terminal;
   a resistor having a first terminal coupled to the first input of the first operational amplifier and having a second terminal; and
   an input current source having a first terminal coupled to the second terminal of the resistor and having a second terminal coupled to the common potential.

6. The logarithmic converter circuit of claim 5, further comprising a buffer having an input coupled to the high-pass filter and an output coupled to the control terminal.

7. The logarithmic converter circuit of claim 6, wherein the buffer comprises:
   a second transistor having a control terminal coupled to a capacitor, a third terminal coupled to a first potential, and a fourth terminal coupled to the control terminal of the first transistor; and
   a third transistor having a control terminal coupled to the third terminal of the second transistor, a fifth terminal coupled to the first potential, and a sixth terminal coupled to the control terminal of the first transistor.

8. The logarithmic converter circuit of claim 7, wherein the control terminal of the second transistor is a base, the third terminal of the second transistor is a collector, and the fourth terminal of the second transistor is an emitter.

9. The logarithmic converter circuit of claim 7, wherein the control terminal of the third transistor is a base, the fifth terminal of the third transistor is an emitter, and the sixth terminal of the third transistor is a collector.

10. A logarithmic converter circuit comprising:
    a converter input and a converter output;
    a first transistor having a control terminal, a first terminal coupled to the converter input and a second terminal coupled to the converter output;
    a first operational amplifier having a first input coupled to the converter input, a second input coupled to a common potential, and an output coupled to the second terminal;
    a second operational amplifier having an output, a third input coupled to the control terminal, and a fourth input adapted to be coupled to a bias source;
    a first resistor coupled between the control terminal and the output of the second operational amplifier; and
    a first capacitor coupled between the first terminal and the first resistor.

11. The logarithmic converter circuit of claim 10, wherein the second operational amplifier is operable to regulate a voltage at the control terminal of the first transistor.

12. The logarithmic converter circuit of claim 10, further comprising a buffer having an input coupled to the first capacitor and the first resistor, and an output coupled to the control terminal of the first transistor.

13. The logarithmic converter circuit of claim 12, wherein the buffer comprises:
    a second transistor having a control terminal coupled to the first capacitor, a third terminal coupled to a first potential, and a fourth terminal coupled to the control terminal of the first transistor; and
    a third transistor having a control terminal coupled to the third terminal of the second transistor, a fifth terminal coupled to the first potential, and a sixth terminal coupled to the control terminal of the first transistor.

14. The logarithmic converter circuit of claim 10, wherein the first capacitor and the first resistor are coupled to the control terminal of the first transistor via a buffer.

15. The logarithmic converter circuit of claim 10, wherein the control terminal is a base, the first terminal is a collector, and the second terminal is an emitter.

16. The logarithmic converter circuit of claim 10, further comprising:
   a second resistor having a first terminal coupled to the first input of the first operational amplifier; and
   a current source having a first terminal coupled to the second terminal of the second resistor and a second terminal coupled to the common potential.

17. The logarithmic converter circuit of claim 10, wherein the first input of the first operational amplifier is an inverting input, the second input of the first operational amplifier is a non-inverting input, the third input of the second operational amplifier is an inverting input, and the fourth input of the second operational amplifier is a non-inverting input.

18. A logarithmic converter circuit comprising:
   a converter input and a converter output;
   a first transistor having a base, a collector coupled to the converter input and an emitter coupled to the converter output;
   a first operational amplifier having an inverting input coupled to the converter input, a non-inverting input coupled to a common potential, and an output coupled to the converter output;
   a second operational amplifier having an output, an inverting input coupled to the base, and a non-inverting input adapted to be coupled to a bias voltage, the second operational amplifier operable to regulate a voltage at the base of the first transistor responsive to the bias voltage;
   a buffer having an input, and an output coupled to the base; and
   a high-pass filter having a first terminal coupled to the collector, a second terminal coupled to the input of the buffer, and a third terminal coupled to the output of the second operational amplifier, the high-pass filter operable to electrically couple the base to the collector if the input current has a high frequency and operable to electrically de-couple the base from the collector if the input current is a direct current (DC).

19. The logarithmic converter circuit of claim 18, wherein the high-pass filter comprises:
   a first resistor coupled between the input of the buffer and the output of the second operational amplifier; and
   a first capacitor coupled between the collector and the input of the buffer.

20. The logarithmic converter circuit of claim 18, wherein the buffer comprises:
   a second transistor having a base coupled to a first capacitor, a collector coupled to a first potential, and an emitter coupled to the base of the first transistor; and
   a third transistor having a base coupled to the collector of the second transistor, an emitter coupled to the first potential, and a collector coupled to the base of the first transistor.

\* \* \* \* \*